(12) United States Patent
Zhang et al.

(10) Patent No.: US 12,713,734 B2
(45) Date of Patent: Aug. 18, 2026

(54) SOLAR CELL AND PHOTOVOLTAIC MODULE

(71) Applicants: JINKO SOLAR (HAINING) CO., LTD., Haining City (CN); ZHEJIANG JINKO SOLAR CO., LTD., Haining (CN)

(72) Inventors: Bike Zhang, Haining City (CN); Bo Zhang, Haining City (CN); Xinyu Zhang, Haining City (CN); Jingsheng Jin, Haining City (CN); Zhaoxuan Liu, Haining City (CN); Ziqi Guo, Haining City (CN)

(73) Assignees: JINKO SOLAR (HAINING) CO., LTD., Zhejiang (CN); ZHEJIANG JINKO SOLAR CO., LTD., Zhejiang (CN)

( * ) Notice: Subject to any disclaimer, the term of this patent is extended or adjusted under 35 U.S.C. 154(b) by 92 days.

(21) Appl. No.: 18/793,682

(22) Filed: Aug. 2, 2024

(65) Prior Publication Data

US 2025/0107273 A1 Mar. 27, 2025

Related U.S. Application Data

(63) Continuation of application No. 18/531,654, filed on Dec. 6, 2023, now Pat. No. 12,142,698.

(30) Foreign Application Priority Data

Sep. 22, 2023 (CN) ......................... 202311237946.5

(51) Int. Cl.
*H10F 77/30* (2025.01)
*H10F 19/80* (2025.01)

(52) U.S. Cl.
CPC ........... *H10F 77/315* (2025.01); *H10F 19/80* (2025.01)

(58) Field of Classification Search
CPC ....... H10F 77/315; H10F 19/80; H10F 71/129
See application file for complete search history.

(56) References Cited

U.S. PATENT DOCUMENTS 11,114,575 B1 9/2021 Jin et al.
2007/0148810 A1 6/2007 Klein et al.
(Continued)

FOREIGN PATENT DOCUMENTS

CN 107068774 A 8/2017
CN 109087956 A 12/2018
(Continued)

OTHER PUBLICATIONS

Yuan, Xiao-jia, CN 114256385 A, English Machine Translation. (Year: 2022).*

(Continued)

*Primary Examiner* — Tae-Sik Kang
(74) *Attorney, Agent, or Firm* — USCH Law, PC

(57) ABSTRACT

Provided is a solar cell including: a silicon substrate, a passivation layer, a first antireflection layer, a second anti-reflection layer, a third antireflection layer, a tunneling dielectric layer formed over the rear surface, and a doped conductive layer formed over the tunneling dielectric layer. The silicon substrate includes at least one of P, Bi, Sb or As. The passivation layer includes an $Al_xO_y$ material and is formed over the front surface, where $⅓\leq x/y\leq 3$. The first antireflection layer includes a $S_iN_j$ material and is formed over the passivation layer, where $0.5\leq i/j\leq 10$. The second antireflection layer includes a $SicN_dO_e$ material and is formed over the first antireflection layer, where $0.5\leq c/d\leq 10$, and $0.25\leq d/e\leq 2$. The third antireflection layer includes a $Si_aO_b$ material and is formed over the second antireflection layer, where $0.5\leq a/b\leq 3$.

18 Claims, 4 Drawing Sheets

(56) References Cited

U.S. PATENT DOCUMENTS

| | | | | |
|---|---|---|---|---|
| 2009/0194151 | A1* | 8/2009 | Ishikawa | H10F 77/211 257/E31.124 |
| 2017/0240670 | A1* | 8/2017 | Costa | C08L 23/0869 |
| 2018/0190919 | A1 | 7/2018 | Schmidt et al. | |
| 2019/0109257 | A1* | 4/2019 | Eisenberg | H10F 77/311 |
| 2019/0221700 | A1* | 7/2019 | Mitta | H10F 77/227 |
| 2020/0343391 | A1 | 10/2020 | Choi et al. | |
| 2023/0253514 | A1 | 8/2023 | Li et al. | |

FOREIGN PATENT DOCUMENTS

| | | | | |
|---|---|---|---|---|
| CN | 113299768 A | | 8/2021 | |
| CN | 215869401 U | | 2/2022 | |
| CN | 114242803 A | | 3/2022 | |
| CN | 114256385 A | * | 3/2022 | H10F 10/146 |
| JP | 2014110432 A | | 6/2014 | |
| JP | 2015176952 A | | 10/2015 | |
| JP | 2017041590 A | | 2/2017 | |
| JP | 2018201053 A | | 12/2018 | |
| JP | 2022128577 A | | 9/2022 | |
| JP | 2023033029 A | | 3/2023 | |
| JP | 2023040981 A | | 3/2023 | |
| JP | 2023042491 A | | 3/2023 | |

OTHER PUBLICATIONS

Jinko Solar (Haining) Co., Ltd. et al., Non Final Rejection, U.S. Appl. No. 18/531,654, filed Mar. 5, 2024, 13 pgs.

Jinko Solar (Haining) Co., Ltd. et al., Extended European Search Reprt, EP 23213963.4, Jun. 5, 2024, 8 pgs.

* cited by examiner

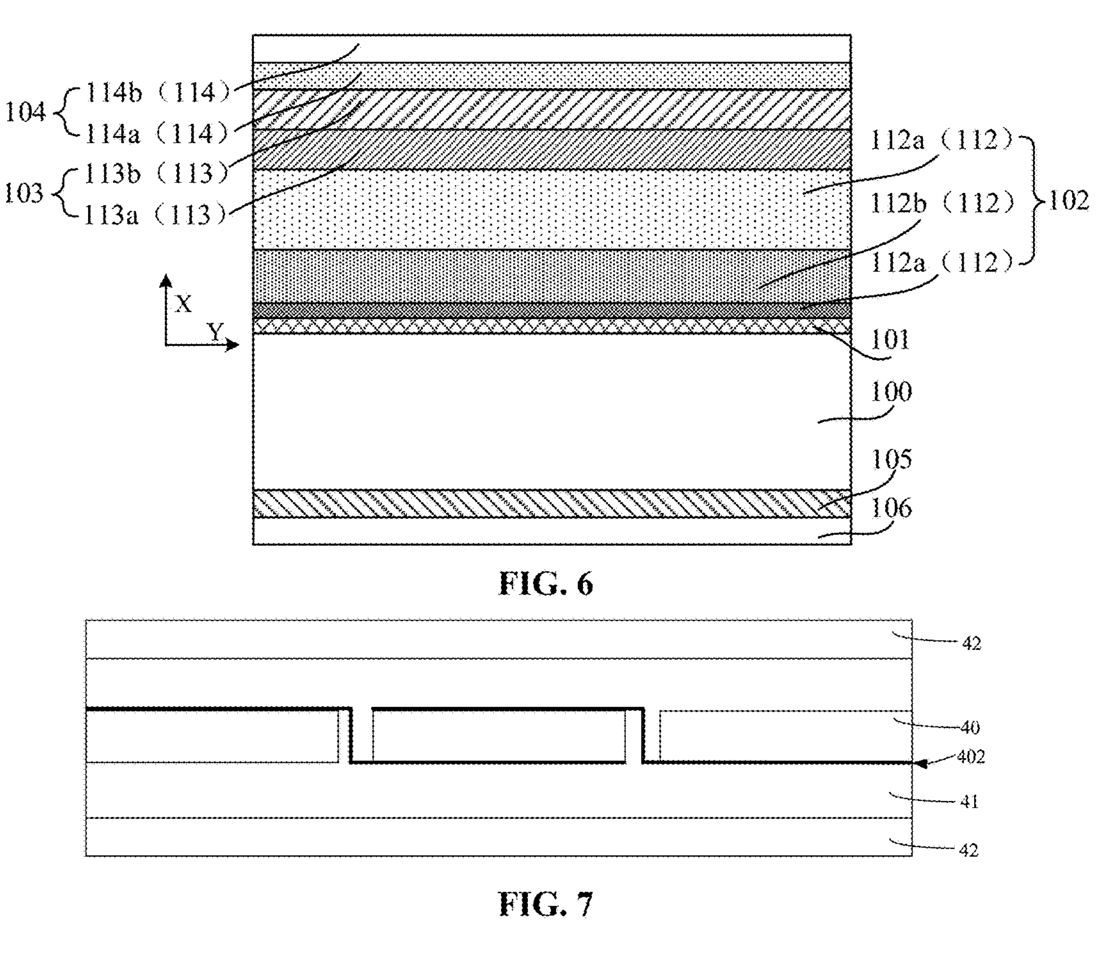
FIG. 6
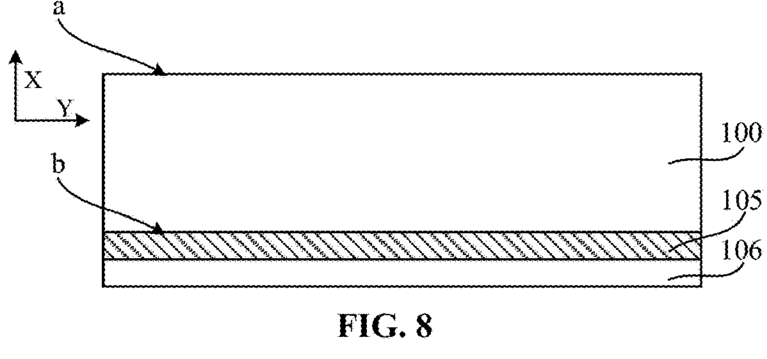
FIG. 7
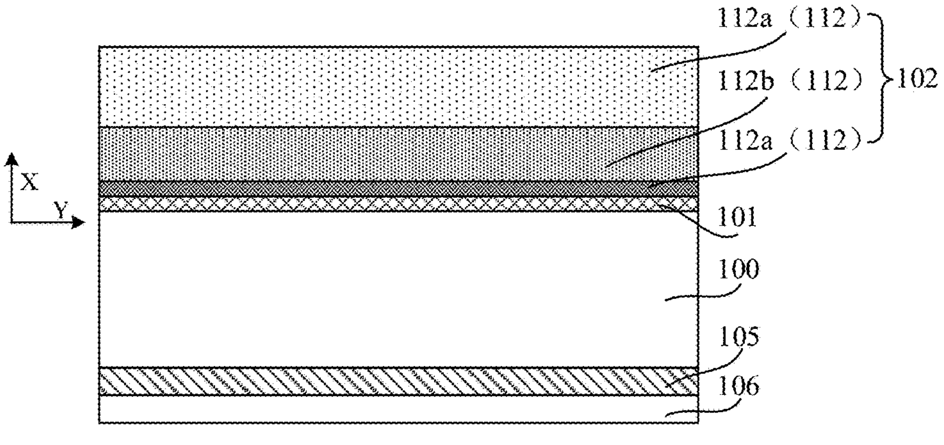
FIG. 8
112a（112）
112b（112）
112a（112）
102
X
Y
101
100
105
106
FIG. 9

SOLAR CELL AND PHOTOVOLTAIC MODULE

CROSS REFERENCE TO RELATED APPLICATIONS

The present application is a continuation of U.S. patent application Ser. No. 18/531,654, filed on Dec. 6, 2023, which claims the benefit of priority under the Paris Convention to Chinese Patent Application No. CN202311237946.5 filed on Sep. 22, 2023, each of which is incorporated herein by reference in its entirety.

TECHNICAL FIELD

Embodiments of the present disclosure relate to the field of solar cell technologies, and in particular, to a solar cell and a photovoltaic module.

BACKGROUND

At present, with the gradual depletion of fossil energy, solar cells are becoming more widely used as a novel energy alternative solution. Solar cells are apparatuses that convert the sun's light energy into electrical energy. In the solar cells, the photovoltaic principle is utilized to generate carriers, and then the carriers are drawn by electrodes thereby facilitating efficient utilization of the electrical energy.

At present, high-efficiency N-type solar cells mainly include interdigitated back contact (IBC) cells, tunnel oxide passivated contact (TOPCON) cells, heterojunction with intrinsic thinfilm (HJT) cells, and the like. However, in order to further improve the photoelectric conversion efficiency of N-type solar cells, the setting of film layers, especially on the front light receiving surface, needs to be further studied.

SUMMARY

Embodiments of the present disclosure provide a solar cell and a photovoltaic module, which at least facilitates improving the light absorption efficiency of the solar cell and improving the effect of isolation of the solar cell from the outside.

In some embodiments, a solar cell is provided. The solar cell includes a silicon substrate, a passivation layer, a first antireflection layer, a second antireflection layer, a third antireflection layer, a tunneling dielectric layer and a doped conductive layer. The silicon substrate has a front surface and a rear surface opposite to the front surface. The silicon substrate includes at least one of a phosphorus (P) element, a bismuth (Bi) element, an antimony (Sb) element, or an arsenic (As) element. The passivation layer includes an aluminum oxide ($Al_xO_y$) material and is formed over the front surface, where ⅓≤x/y≤3, x/y representing a ratio of content of aluminum to content of oxygen in the passivation layer. The first antireflection layer includes a silicon nitride ($Si_iN_j$) material and is formed over the passivation layer, where 0.5≤i/j≤10, i/j representing a ratio of content of silicon to content of nitrogen in the first antireflection layer. The second antireflection layer includes a silicon oxynitride ($Si_cN_dO_e$) material and is formed over the first antireflection layer, where 0.5≤c/d≤10, and 0.25≤d/e≤2, c/d representing a ratio of content of silicon to content of nitrogen in the second antireflection layer, and d/e representing a ratio of content of nitrogen to content of oxygen in the second antireflection layer. The third antireflection layer includes a silicon oxide ($Si_aO_b$) material and is formed over the second antireflection layer, where 0.5≤a/b≤3, a/b representing a ratio of content of silicon to content of oxygen in the third antireflection layer. The tunneling dielectric layer is formed over the rear surface. The doped conductive layer is formed over the tunneling dielectric layer.

In some embodiments, the third antireflection layer has an uneven surface facing away from the second antireflection layer.

In some embodiments, the third antireflection layer has a minimum thickness and a maximum thickness, and a ratio of the minimum thickness to the maximum thickness is not greater than 0.5.

In some embodiments, in a direction away from the second antireflection layer, content percentage of silicon in the third antireflection layer gradually decreases, and content percentage of oxygen in the third antireflection layer gradually increases.

In some embodiments, the third antireflection layer includes N third sub-antireflection layers stacked in the direction away from the second antireflection layer, each of the N third sub-antireflection layers includes a silicon oxide material, where N is a positive integer greater than or equal to 2; and in the direction away from the second antireflection layer, content percentage of silicon in the N third sub-antireflection layers decreases layer by layer, and content percentage of oxygen in the N third sub-antireflection layers increases layer by layer.

In some embodiments, in the direction away from the second antireflection layer, a single third sub-antireflection layer is 2 nm to 15 nm in thickness, and the third antireflection layer is 2 nm to 40 nm in thickness.

In some embodiments, a single third sub-antireflection layer has uniformly-distributed silicon content and uniformly-distributed oxygen content.

In some embodiments, the third antireflection layer is 2 nm to 40 nm in thickness.

In some embodiments, the tunneling dielectric layer is 1 nm to 2.5 nm in thickness, and the third antireflection layer is thicker than the tunneling dielectric layer.

In some embodiments, the third antireflection layer further includes nitrogen, and content percentage of nitrogen in the third antireflection layer is less than 5%.

In some embodiments, in a direction away from the passivation layer, content percentage of silicon in the first antireflection layer gradually decreases, and content percentage of nitrogen in the first antireflection layer gradually increases.

In some embodiments, the first antireflection layer includes M first sub-antireflection layers stacked in the direction away from the passivation layer, each of the M first sub-antireflection layers includes a silicon nitride material, where M is a positive integer greater than or equal to 2; and in the direction away from the passivation layer, content percentage of silicon in the M first sub-antireflection layers decreases layer by layer, and content percentage of nitrogen in the M first sub-antireflection layers increases layer by layer.

In some embodiments, thicknesses of the M first sub-antireflection layers increase layer by layer in the direction away from the passivation layer, one of the M first sub-antireflection layers closest to the passivation layer is 2 nm to 15 nm in thickness, and the first antireflection layer is 5 nm to 50 nm in thickness.

In some embodiments, a single first sub-antireflection layer has uniformly-distributed silicon content and uniformly-distributed nitrogen content.

In some embodiments, the first antireflection layer further includes oxygen, and content percentage of oxygen in the first antireflection layer is less than 5%.

In some embodiments, in a direction away from the first antireflection layer, content percentage of silicon in the second antireflection layer gradually decreases, content percentage of nitrogen in the second antireflection layer gradually decreases, and content percentage of oxygen in the second antireflection layer gradually increases.

In some embodiments, the second antireflection layer includes P second sub-antireflection layers stacked in the direction away from the first antireflection layer, each of the P second sub-antireflection layers includes a silicon oxynitride material, where P is a positive integer greater than or equal to 2; and in the direction away from the first antireflection layer, content percentage of silicon in the P second sub-antireflection layers decreases layer by layer, content percentage of nitrogen in the P second sub-antireflection layers decreases layer by layer, and content percentage of oxygen in the P second sub-antireflection layers increases layer by layer.

In some embodiments, in the direction away from the first antireflection layer, a single second sub-antireflection layer is 5 nm to 40 nm in thickness, and the second antireflection layer is 10 nm to 60 nm in thickness.

In some embodiments, the second antireflection layer is 10 nm to 60 nm in thickness.

BRIEF DESCRIPTION OF THE DRAWINGS

One or more embodiments are exemplarily described with reference to the corresponding figures in the accompanying drawings, and the exemplary descriptions are not to be construed as limiting the embodiments. Elements in the accompanying drawings that have same reference numerals are represented as similar elements, and unless otherwise particularly stated, the figures in the accompanying drawings do not constitute scale limitation. To describe the technical solutions in the embodiments of the present disclosure or in the conventional technologies more clearly, the following briefly introduces the accompanying drawings required for describing the embodiments. Apparently, the accompanying drawings in the following description show merely some embodiments of the present disclosure, and a person of ordinary skill in the art may still derive other accompanying drawings from these accompanying drawings without creative efforts.

FIG. 1 to FIG. 6 are six schematic sectional structural diagrams of a solar cell according to an embodiment of the present disclosure;

FIG. 7 is a schematic structural diagram of a photovoltaic module according to another embodiment of the present disclosure; and FIG. 8 to FIG. 9 are schematic sectional structural diagrams corresponding to steps in a solar cell manufacturing method according to still another embodiment of the present disclosure.

DETAILED DESCRIPTION

It can be known from the background that the photoelectric conversion efficiency of solar cells needs to be improved.

Embodiments of the present disclosure provide a solar cell and a photovoltaic module. In the solar cell, a novel multiple-layered antireflection film formed by stacking a first antireflection layer, a second antireflection layer and a third antireflection layer is designed, and a passivation layer including an aluminum oxide material is disposed between an N-type silicon substrate and the novel laminated antireflection film, so as to facilitate improving the light absorption efficiency of the N-type silicon substrate, improving the light utilization rate of the solar cell, increasing the short-circuit current of the solar cell to improve the photoelectric conversion efficiency of the solar cell, and improving the effect of isolation of the solar cell from the outside.

The following describes the embodiments of the present disclosure in detail with reference to the accompanying drawings. However, a person of ordinary skill in the art may understand that in the embodiments of the present disclosure, many technical details are provided to make readers better understand the embodiments of the present disclosure. However, even without these technical details and various changes and modifications based on the following embodiments, the technical solutions claimed in the embodiments of the present disclosure can be implemented.

An embodiment of the present disclosure provides a solar cell, which will be described in detail below with reference to the accompanying drawings. FIGS. 1 to 6 are six schematic sectional structural diagrams of a solar cell according to an embodiment of the present disclosure. It is to be noted that, to facilitate the description and clearly illustrate steps of a semiconductor structure manufacturing method, all of FIGS. 1 to 6 in this embodiment are schematic partial structural diagrams of the solar cell.

Figure 1:
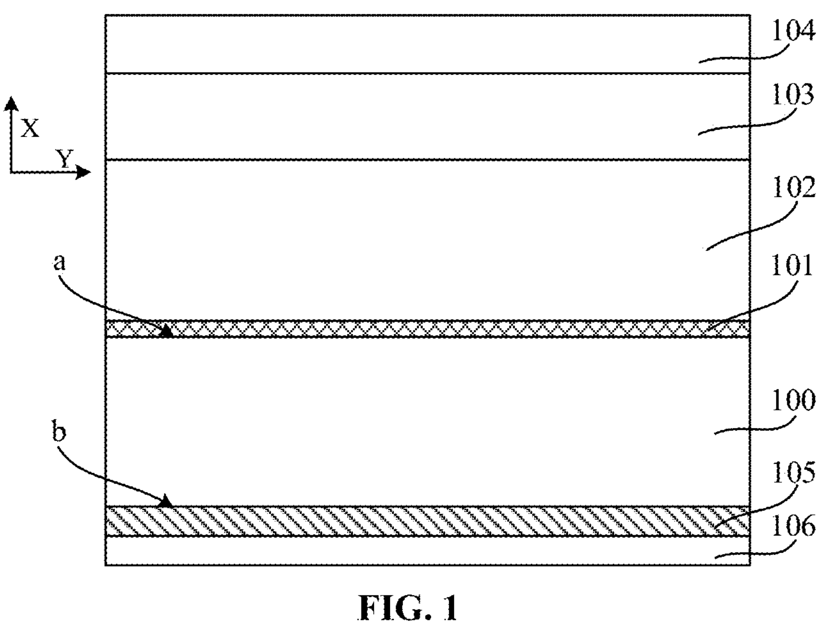

Referring to FIG. 1, the solar cell includes an N-type silicon substrate 100, a passivation layer 101, a first antireflection layer 102, a second antireflection layer 103, a third antireflection layer 104, a tunneling dielectric layer 105 and a doped conductive layer 106. The N-type silicon substrate 100 has a front surface a and a rear surface b opposite to the front surface. The passivation layer 101 includes an aluminum oxide material and is located on the front surface a. The first antireflection layer 102 includes a silicon nitride material and is located on the passivation layer 101. The second antireflection layer 103 includes a silicon oxynitride material and is located on the first antireflection layer 102. The third antireflection layer 104 includes a silicon oxide material and is located on the second antireflection layer 103. The tunneling dielectric layer 105 is located on the rear surface b, and the doped conductive layer 106 is located on the tunneling dielectric layer 105.

It should be noted that, a material of an individual film layer in the solar cell is not a single uniform compound material, but a mixture of elements in the compound material. Content ratios of different elements in a certain film layer directly cause changes in properties of the film layer. The properties of the film layer include, but not limited to, characteristics such as a refractive index and a density of the film layer. Therefore, designing of a multiple-layered film matching the performance of the solar cell is of great significance to improvement of the light absorption efficiency of the solar cell. The film layers in the solar cell include, but not limited to, the passivation layer 101, the first antireflection layer 102, the second antireflection layer 103, and the third antireflection layer 104.

In this way, the first antireflection layer 102, the second antireflection layer 103, and the third antireflection layer 104 stacked in the direction X constitute a novel multiple-layered antireflection film. On the one hand, the third antireflection layer 104 includes a silicon oxide material, and due to a high density and stable chemical properties, the silicon oxide material is conducive to increasing the density of the third antireflection layer 104 and making the third antireflection layer 104 highly stable, thereby helping to protect other film layers under the third antireflection layer 104, for example, helping to avoid the second antireflection layer 103, the first antireflection layer 102, the passivation layer 101, and the N-type silicon substrate 100 from being oxidized by external oxygen and contaminated by external water vapor and the like. On the other hand, the light absorption efficiency of the N-type silicon substrate 100 is improved mainly through the first antireflection layer 102 containing a silicon nitride material and the second antireflection layer 103 containing a silicon oxynitride material, and the third antireflection layer 104 containing the silicon oxide material has a lower refractive index than the first antireflection layer 102 and the second antireflection layer 103, which helps to enhance the incidence of light, that is, causing more light incident into the third antireflection layer 104 to be received by the second antireflection layer 103. In addition, lattices of the passivation layer 101 containing an aluminum oxide material are more compatible with lattices of the N-type silicon substrate 100 than lattices of the first antireflection layer 102 containing the silicon nitride material, which facilitates avoiding large lattice mismatch between the N-type silicon substrate 100 and the first antireflection layer 102 in the case where the N-type silicon substrate 100 is in direct contact with the first antireflection layer 102, to avoid an increase of surface defects caused by the lattice mismatch, thereby improving the interface passivation effect on the N-type silicon substrate 100 to increase the open-circuit voltage of the solar cell.

Therefore, the novel multiple-layered antireflection film formed by stacking the first antireflection layer 101, the second antireflection layer 102 and the third antireflection layer 103 is designed, and the passivation layer 101 including an aluminum oxide material is disposed between the N-type silicon substrate 100 and the novel laminated antireflection film, so as to facilitate improving the light absorption efficiency of the N-type silicon substrate, improving the light utilization rate of the solar cell, increasing the short-circuit current of the solar cell to improve the photoelectric conversion efficiency of the solar cell, and improving the effect of isolation of the solar cell from the outside.

In some embodiments, the silicon nitride material has a high density with respect to the fixed positive charges, so that the first antireflection layer 102 including the silicon nitride material has a good hydrogen passivation effect on the N-type silicon substrate 100. The silicon nitride material has a relatively high refractive index, so that the first antireflection layer 102 has a relatively strong ability to absorb incident light, thereby remedying the shortcoming of the passivation layer 101, which has relatively low utilization rate of incident light due to a relatively low refractive index. The second antireflection layer 103 including a silicon oxynitride material is conducive to causing the solar cell to have relatively high absorption efficiency for short-wavelength light.

In addition, the second antireflection layer 103 having a relatively high refractive index is conducive to causing the light in the second antireflection layer 103 to be incident into the first antireflection layer 102 at a smaller incident angle, thereby helping to allow more light to pass through the second antireflection layer 103 and enter the first antireflection layer 102. The first antireflection layer 102 has a higher refractive index than the second antireflection layer 103, so as to facilitate reducing the internal reflection and emission of light in the first antireflection layer 102, thereby helping to reduce internal friction of the light in the first antireflection layer 102, and allowing more light to pass through the first antireflection layer 102 and enter the N-type silicon substrate 100.

A more detailed description on the solar cell provided in this embodiment of the present disclosure is provided below with reference to the accompanying drawings.

In some embodiments, the N-type silicon substrate 100 is configured to receive incident light and generate photo-generated carriers. A material of the N-type silicon substrate 100 may include at least one of monocrystalline silicon, polycrystalline silicon, amorphous silicon, or microcrystalline silicon.

In some embodiments, the N-type silicon substrate 100 includes a base region (not shown) and an emitter (not shown). The base region includes an N-type doped element, and the emitter includes a P-type doped element. A PN junction is formed between the emitter and the base region, and the passivation layer 101 covers the emitter. The N-type doped element may include at least one of Group V elements such as a phosphorus (P) element, a bismuth (Bi) element, an antimony (Sb) element, or an arsenic (As) element, and the P-type doped element may include at least one of Group III elements such as a boron (B) element, an aluminum (Al) element, a gallium (Ga) element, or an indium (In) element.

In some embodiments, the emitter may be obtained by diffusion doping of the P-type doped element on a surface layer of the base region, and the doped part of the base region is converted into the emitter.

In some embodiments, the front surface a is a light-receiving surface, and the rear surface b is a back surface opposite to the light-receiving surface. The front surface a may be set as a pyramid textured surface, to reduce the light reflection of the front surface a and improve the absorption and utilization rate of the front surface a for light, thereby improving the photoelectric conversion efficiency of the solar cell. In some embodiments, the rear surface b may be set as a non-pyramid-shaped textured surface, such as a stacked and stepped morphology, to ensure that the tunneling dielectric layer 105 covering the rear surface b has a relatively high density and a relatively high uniformity, thereby ensuring that the tunneling dielectric layer 105 has a good passivation effect on the rear surface b.

In some embodiments, the solar cell is a single-sided cell, where the front surface a may be used as a light receiving surface to receive incident light, and the rear surface b may be used as a backlight surface. In some other embodiments, the solar cell is a double-sided cell, where both the front surface a and the rear surface b may be used as light receiving surfaces and may be configured to receive incident light.

In some embodiments, the tunneling dielectric layer 105 and the doped conductive layer 106 may serve as a passivation contact structure of the solar cell. The passivation contact structure is capable of forming band bending on the rear surface b of the N-type silicon substrate to realize selective transport of carriers.

In some embodiments, the tunneling dielectric layer 105 and the doped conductive layer 106 have doped elements of a same conductivity type. It should be noted that, the doped elements of the same conductivity type in the tunneling dielectric layer 105 and the doped conductive layer 106 refer to that: both the tunneling dielectric layer 105 and the doped conductive layer 106 have N-type doped elements, and the N-type doped elements contained in the tunneling dielectric layer 105 and the doped conductive layer 106 may be same elements or different elements in the Group V elements such as the P element, the Bi element, the Sb element, or the As element. Alternatively, both the tunneling dielectric layer 105 and the doped conductive layer 106 have P-type doped elements, and the P-type doped elements contained in the tunneling dielectric layer 105 and the doped conductive layer 106 may be same elements or different elements in the Group III elements such as the B element, the Al element, the Ga element, or the In element.

In some embodiments, the tunneling dielectric layer 105 contains a doped silicon oxide material, that is, there is a small amount of doped elements in the tunneling dielectric layer 105. The conductivity types of the doped elements in the tunneling dielectric layer 105 and the doped conductive layer 106 are the same. In some cases, the small amount of doped elements in the tunneling dielectric layer 105 may be formed by diffusion in the doped conductive layer 106. However, the third antireflection layer 104 is different from the tunneling dielectric layer 105. The third antireflection layer 104 has no P-type doped element and no N-type doped element.

In some embodiments, a thickness of the tunneling dielectric layer 105 in a direction away from the substrate is less than a thickness of the third antireflection layer 104 in the direction X. In some examples, the thickness of the tunneling dielectric layer 105 in the direction away from the substrate is 1 nm to 2.5 nm, such as 1.2 nm, 1.4 nm, 1.6 nm, or 1.8 nm; and a thickness of the third antireflection layer 104 in the direction X is in a range of 2 nm to 40 nm.

In some cases, on the one hand, the tunneling dielectric layer 105 is relatively thin (≤2.5 nm) in the direction away from the substrate, so that the tunneling dielectric layer 105 has a quantum tunneling effect. On the other hand, the tunneling dielectric layer 105 has doped elements that are diffused from the doped conductive layer 106 into the tunneling dielectric layer 105, so that the tunneling dielectric layer 105 has a certain "conductive characteristic" and allows majority carriers to pass through the tunneling dielectric layer 105. However, the third antireflection layer 104 is thicker in the direction X than the tunneling dielectric layer 105, and has no doped element, so that the third antireflection layer 104 does not have the same "conductive characteristic" as the tunneling dielectric layer 105.

In other words, a dielectric constant of the third antireflection layer 104 is greater than a dielectric constant of the tunneling dielectric layer 105, that is, the insulation performance of the third antireflection layer 104 is better than the insulation performance of the tunneling dielectric layer 105. It should be understood that the third antireflection layer 104 has relatively good insulation performance, a greater thickness, and a high density, thereby helping to protect other film layers under the third antireflection layer 104 by means of the third antireflection layer 104, for example, helping to avoid the second antireflection layer 103, the first antireflection layer 102, the passivation layer 101 and the N-type silicon substrate 100 from being oxidized by external oxygen and contaminated by external water vapor and the like, to improve the film layer stability of the third antireflection layer 104 and improve the effect of isolation of the solar cell from the outside.

In some embodiments, the solar cell provided may be a TOPCON cell or an IBC cell.

In some embodiments, the solar cell may be a TOPCON cell, and the doped conductive layer 106 and the N-type silicon substrate 100 have doped elements of the same conductivity type.

In some other embodiments, the solar cell may be an IBC cell, and the doped conductive layer 106 includes an N-type doped conductive layer and a P-type doped conductive layer. In some cases, some regions of the doped conductive layer 106 and the N-type silicon substrate 100 have a doped element whose conductivity type is the same as that of the N-type silicon substrate 100, and other regions of the doped conductive layer 106 have a doped element whose conductivity type is different from that of the N-type silicon substrate 100. Similarly, the tunneling dielectric layer 105 in contact connection with the N-type doped conductive layer also has an N-type doped element, and the tunneling dielectric layer 105 in contact connection with the P-type doped conductive layer also has a P-type doped element.

Figure 2:
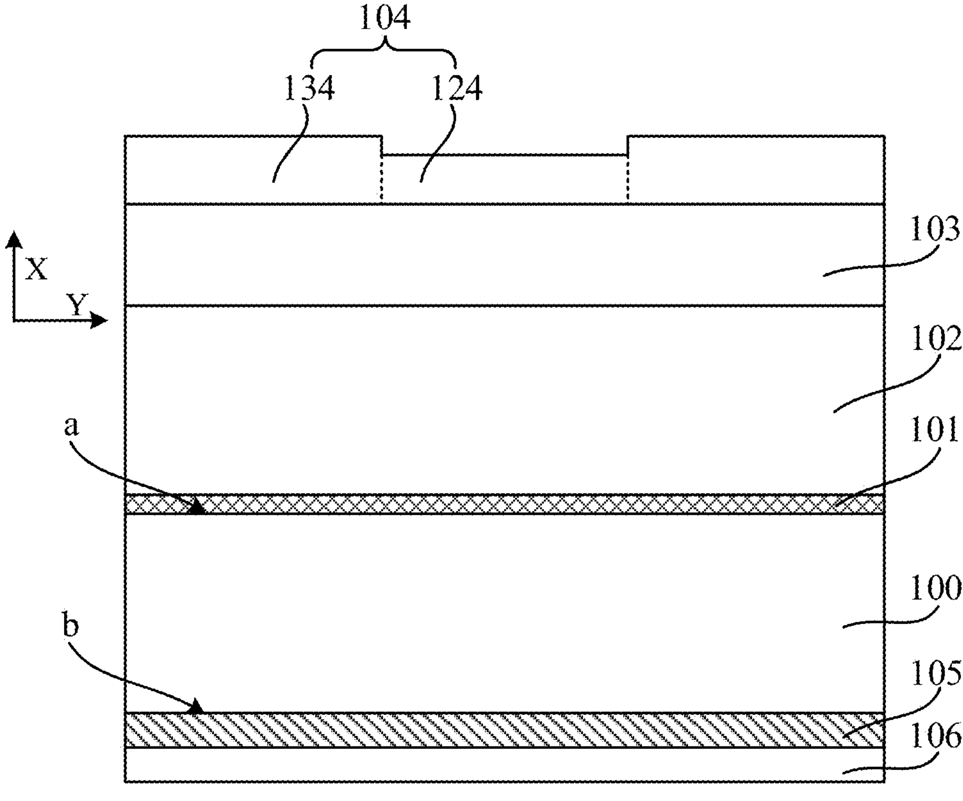

In some embodiments, referring to FIG. 2, the third antireflection layer 104 includes a first portion 124 and a second portion 134 in a direction Y perpendicular to the direction away from the second antireflection layer 103 (i.e., the direction Y perpendicular to the direction X), and thicknesses of the first portion 124 and the second portion 134 in the direction X in which the N-type silicon substrate 100 points to the passivation layer 101 are different, that is, the third antireflection layer 104 is not uniform in thickness in the direction X, or the third antireflection layer 104 has an uneven surface facing away from the second antireflection layer 103.

It should be noted that, FIG. 2 is only an example of the non-uniform thickness of the third antireflection layer 104 in the direction X, and only one first portion 124 and one second portion 134 are illustrated in FIG. 2. In practice, the third antireflection layer 104 may have a plurality of first portions 124 and a plurality of second portions 134, and thicknesses of different second portions 134 in the direction X may be different. In addition, the first portion 124 and the second portion 134 are differentiated by using dashed lines in FIG. 2.

In some embodiments, a ratio of a minimum value of a thickness of the third antireflection layer 104 to a maximum value of the thickness of the third antireflection layer 104 is not greater than 50% in the direction X in which the N-type silicon substrate 100 points to the passivation layer 101. It should be noted that, the third antireflection layer 104 is not uniform in thickness in the direction X. The minimum value of the thickness of the third antireflection layer 104 is the thickness of the thinnest portion of the third antireflection layer 104, and the maximum value of the thickness of the third antireflection layer 104 is the thickness of the thickest portion of the third antireflection layer 104.

For example, referring to FIG. 2, the ratio of the thickness of the first portion 124 to the thickness of the second portion 134 is not greater than 50% in the direction X.

Figure 3:
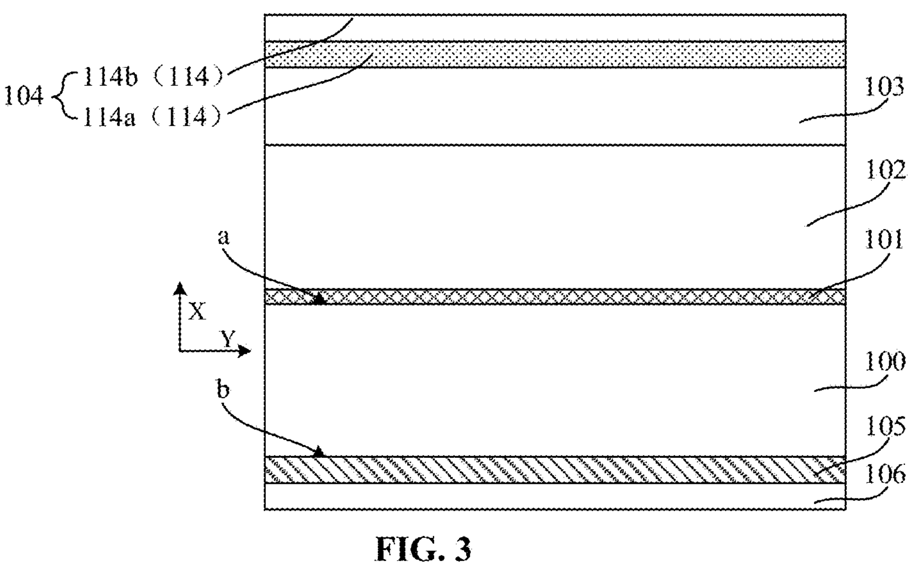

In some embodiments, referring to FIG. 3 or FIG. 6, the third antireflection layer 104 may include N third sub-antireflection layers 114 stacked in a direction X away from the second antireflection layer 103, and each of the N third sub-antireflection layers 114 includes the silicon oxide material, where N is a positive integer greater than or equal to 2. In the direction X, content percentages of a silicon element in the N third sub-antireflection layers 114 decrease layer by layer, and content percentages of an oxygen element in the N third sub-antireflection layers 114 increase layer by layer. A content percentage of an element in a layer herein refers to atomic fraction of the element in the layer, which can be measured by EDS test or SIMS test.

In some cases, in the third antireflection layer 104, a third sub-antireflection layer 114 closer to the second antireflection layer 103 has a higher silicon element content and a lower oxygen element content, thereby adjusting the refractive index of the third sub-antireflection layer 114 to be moderate, and a third sub-antireflection layer 114 farther away from the second antireflection layer 103 has a lower silicon element content and a higher oxygen element content, thereby adjusting the refractive index of the third sub-antireflection layer 114 to be relatively low. In this way, the refractive index of the third antireflection layer 104 gradually decreases in the direction X, to enhance the refraction utilization of light by the third antireflection layer 104, so that more light can pass through the third antireflection layer 104 and enter the second antireflection layer 103. In addition, the third antireflection layer 104 has a high density, so as to help to protect other film layers under the third antireflection layer 104, for example, helping to avoid the second antireflection layer 103, the first antireflection layer 102, the passivation layer 101 and the N-type silicon substrate 100 from being oxidized by external oxygen and contaminated by external water vapor and the like, to improve the film layer stability of the third antireflection layer 104 and to improve the effect of isolation of the solar cell from the outside.

In other words, refractive indexes of adjacent third sub-antireflection layers 114 decrease layer by layer in the direction X, which helps to allow light in the third sub-antireflection layer 114 farther away from the second antireflection layer 103 to be incident to the third sub-antireflection layer 114 closer to the second antireflection layer 103 with a smaller incident angle, and helps to make the third sub-antireflection layer 114 closer to the N-type silicon substrate 100 have a higher refractive index, to reduce the internal reflection and emission of the light in the third sub-antireflection layer 114 closer to the N-type silicon substrate 100, thereby helping to allow more light to pass through the third antireflection layer 104 and enter the second antireflection layer 103.

In some embodiments, N is 2 or 3.

It should be noted that, in FIG. 3 and FIG. 6, an example in which the third antireflection layer 104 includes two third sub-antireflection layers 114 stacked in the direction X is used. In addition, the two third sub-antireflection layers are distinguished in labelling in FIG. 3 and FIG. 6. For example, in the examples shown in FIG. 3 and FIG. 6, the third sub-antireflection layer 114 close to the second antireflection layer 103 is labeled with 114*a*, and the third sub-antireflection layer 114 away from the second antireflection layer 103 is labeled with 114*b*. In practice, the number of third sub-antireflection layers 114 stacked in the direction X included in the third antireflection layer 104 is not limited.

In some embodiments, a single third sub-antireflection layer 114 has an uniformly-distributed silicon element content and an uniformly-distributed oxygen element content.

In some embodiments, in the direction X away from the second antireflection layer, a thickness of a single third sub-antireflection layer 114 is in a range of 2 nm to 15 nm, and a thickness of the third antireflection layer 104 is in a range of 2 nm to 40 nm.

In some embodiments, thicknesses of different third sub-antireflection layers 114 may all be in a range of 2 nm to 15 nm in the direction X. For example, thicknesses of different third sub-antireflection layers 114 in the direction X may be the same.

In some other embodiments, the third antireflection layer 104 may have a single film layer structure, and in the direction X in which the N-type silicon substrate 100 points to the passivation layer 101, a content percentage of a silicon element in the third antireflection layer 104 gradually decreases, and a content percentage of an oxygen element in the third antireflection layer 104 gradually increases; and a thickness of the third antireflection layer 104 is in a range of 2 nm to 40 nm in the direction X in which the N-type silicon substrate 100 points to the passivation layer 101.

In some cases, in the direction X, the content percentage of the silicon element in the third antireflection layer 104 gradually decreases, and the content percentage of the oxygen element in the third antireflection layer 104 gradually increases, which helps to adjust light in a portion of the third antireflection layer 104 farther away from the second antireflection layer 103 to be incident to a portion of the third antireflection layer 104 closer to the second antireflection layer 103 with a smaller incident angle, and helps to make the portion of the third antireflection layer 104 closer to the second antireflection layer 103 have a higher refractive index, to reduce the internal reflection and emission of light in the portion of the third antireflection layer 104 closer to the second antireflection layer 103, thereby helping to allow more light to pass through the third antireflection layer 104 and enter the second antireflection layer 103. In addition, the third antireflection layer 104 has a high density, which helps to protect other film layers below the third antireflection layer 104 by means of the third antireflection layer 104, for example, avoid the second antireflection layer 103, the first antireflection layer 102, the passivation layer 101 and the N-type silicon substrate 100 from being oxidized by external oxygen and contaminated by external water vapor and the like, to improve the film layer stability of the third antireflection layer 104 and improve the effect of isolation of the solar cell from the outside.

In some embodiments, the third antireflection layer 104 further includes a nitrogen element, and a content percentage of the nitrogen element in the third antireflection layer 104 is less than 5%, which helps to ensure that the third antireflection layer 104 has a relatively high density, thereby ensuring a relatively high film layer stability of the third antireflection layer 104, and ensuring a relatively good effect of isolation of the solar cell from the outside.

In some cases, most of nitrogen in the third antireflection layer 104 may be diffused from the second antireflection layer 103 into the third antireflection layer 104.

In some embodiments, the silicon oxide material contained in the third antireflection layer 104 is a $Si_aO_b$ material, and $0.5 \le a/b \le 3$, where a/b represents a ratio of a content of the silicon element to a content of the oxygen element in the third antireflection layer 104. For example, when the third antireflection layer 104 has a single film layer structure, a/b may be 6/5. a/b can be determined based on atomic fraction of Si and atomic fraction of O. The atomic fraction of Si or O can be obtained by EDS test or SIMS test. In some embodiments, the atomic fraction can be an average atomic fraction of an individual element in layer(s).

It should be noted that, the mathematical formula $Si_aO_b$ containing "a" and "b" herein represents a content ratio of the silicon element to the oxygen element in the third antireflection layer 104, rather than a strict chemical formula or chemical structure. Therefore, the $Si_aO_b$ material may include one or more stoichiometric compounds and/or one or more non-stoichiometric compounds, and values of "a" and "b" (if existent) may be integers or non-integers. As used herein, the term "non-stoichiometric compound" means and includes a compound formed by a certain element that cannot be represented by a well-defined ratio of natural numbers and does not violate the law of definite proportions. The content of each element in the third antireflection layer 104 may be measured and confirmed through tests such as energy dispersive spectrometer (EDS), electron energy loss spectroscopy (EELS), or secondary ion mass spectrometry (SIMS). For example, a measurement device is used to select a specific line region or area region for testing.

Figure 4:
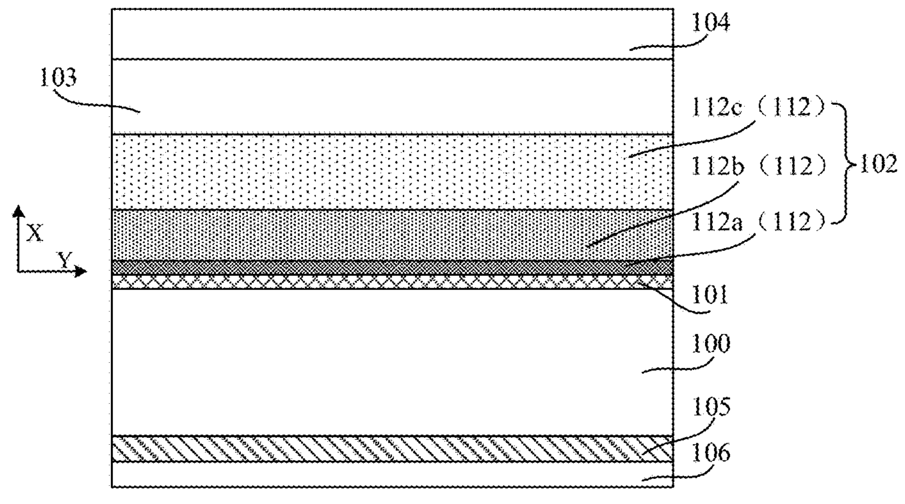

In some embodiments, referring to FIG. 4 or FIG. 6, in the direction X in which the N-type silicon substrate 100 points to the passivation layer 101, the first antireflection layer 102 includes M stacked first sub-antireflection layers 112, and the first sub-antireflection layers 112 each include a silicon nitride material, where M is a positive integer greater than or equal to 2; and in the direction X in which the N-type silicon substrate 100 points to the passivation layer 101, content percentages of the silicon element in adjacent first sub-antireflection layers 112 decrease layer by layer, and content percentages of the nitrogen element in the adjacent first sub-antireflection layers 112 increase layer by layer.

In some cases, in the first antireflection layer 102, a first sub-antireflection layer 112 closer to the N-type silicon substrate 100 has a higher silicon element content and a lower nitrogen element content, thereby adjusting the refractive index of the first sub-antireflection layer 112 to be higher; and a first sub-antireflection layer 112 farther away from the N-type silicon substrate 100 has a lower silicon element content and a higher nitrogen element content, thereby adjusting the refractive index of the first sub-antireflection layer 112 to be relatively low. In this way, the refractive index of the first antireflection layer 102 gradually decreases in the direction X, to enhance the refraction utilization of light by the first antireflection layer 102, so that more light can pass through the first antireflection layer 102 and enter the N-type silicon substrate 100.

In other words, refractive indexes of adjacent first sub-antireflection layers 112 decrease layer by layer in the direction X, which helps to allow light in the first sub-antireflection layer 112 farther away from the N-type silicon substrate 100 to be incident to the first sub-antireflection layer 112 closer to the N-type silicon substrate 100 with a smaller incident angle, and helps to make the first sub-antireflection layer 112 closer to the N-type silicon substrate 100 have a higher refractive index, to reduce the internal reflection and emission of the light in the first sub-antireflection layer 112 closer to the N-type silicon substrate 100, thereby helping to allow more light to pass through the first sub-antireflection layer 112 and enter the N-type silicon substrate 100.

In some embodiments, M is 2 to 5

It should be noted that, in FIG. 4 and FIG. 6, an example in which the first antireflection layer 102 includes three first sub-antireflection layers 112 stacked in the direction X is used. In addition, the three first sub-antireflection layers are distinguished in labelling in FIG. 4 and FIG. 6. For example, in the examples shown in FIG. 4 and FIG. 6, the first sub-antireflection layer 112 closest to the N-type silicon substrate 100 is labelled with 112*a*, the first sub-antireflection layer 112 farthest away from the N-type silicon substrate 100 is labelled with 112*c*, and the first sub-antireflection layer 112 located between 112*a* and 112*c* is labelled with 112*b*. In practice, the number of first sub-antireflection layers 112 stacked in the direction X included in the first antireflection layer 102 is not limited.

In some cases, a content of the silicon element in the first sub-antireflection layer 112*a* is greater than a content of the silicon element in the first sub-antireflection layer 112*b*, the content of the silicon element in the first sub-antireflection layer 112*b* is greater than a content of the silicon element in the first sub-antireflection layer 112*c*, a content of the nitrogen element in the first sub-antireflection layer 112*a* is greater than a content of the nitrogen element in the first sub-antireflection layer 112*b*, and the content of the nitrogen element in the first sub-antireflection layer 112*b* is greater than a content of the nitrogen element in the first sub-antireflection layer 112*c*, so that a refractive index of the first sub-antireflection layer 112*a* is greater than a refractive index of the first sub-antireflection layer 112*b*, and the refractive index of the first sub-antireflection layer 112*b* is greater than a refractive index of the first sub-antireflection layer 112*c*.

In some embodiments, a single first sub-antireflection layer 112 has an uniformly-distributed silicon element content and an uniformly-distributed nitrogen element content.

In some embodiments, in the direction X in which the N-type silicon substrate 100 points to the passivation layer 101, thicknesses of adjacent first sub-antireflection layers 112 increase layer by layer, a thickness of a first sub-antireflection layer 112 closest to the N-type silicon substrate 100 (i.e., the first sub-antireflection layer 112*a*) is in a range of 2 nm to 15 nm, and a thickness of the first antireflection layer 102 is in a range of 5 nm to 50 nm.

It should be noted that, the first sub-antireflection layer 112 closest to the N-type silicon substrate 100 (i.e., the first sub-antireflection layer 112*a*) has the highest silicon element content, so that lattices of the first sub-antireflection layer 112*a* are more compatible with lattices of the passivation layer 101, which facilitates avoiding large lattice mismatch between the first sub-antireflection layer 112 and the passivation layer 101 to avoid an increase of increased surface defects caused by the lattice mismatch, so as to improve the interface passivation effect of the first sub-antireflection layer 112 on the N-type silicon substrate 100, thereby increasing the short-circuit current of the solar cell.

In addition, in the direction X, compared with that the same thickness of different first sub-antireflection layers 112, the layer-by-layer increase in thickness of adjacent first sub-antireflection layers 112 helps to make the first antireflection layer 102 reflect a lower refractive index as a whole, enabling more light to be incident into the first antireflection layer 102, to enhance the incidence of light. In addition, the first sub-antireflection layer 112*a* is thinnest in the direction X, which helps to ensure a good interface passivation effect of the first sub-antireflection layer 112*a* on the N-type silicon substrate 100.

In other embodiments, the first antireflection layer 102 has a single film layer structure, and in the direction X in which the N-type silicon substrate 100 points to the passivation layer 101, a content percentage of the silicon element in the first antireflection layer 102 gradually decreases, and a content percentage of the nitrogen element in the first antireflection layer 102 gradually increases; and a thickness of the first antireflection layer 102 is in a range of 5 nm to 50 nm in the direction X in which the N-type silicon substrate 100 points to the passivation layer 101.

In some cases, in the direction X, the content percentage of the silicon element in the first antireflection layer 102 gradually decreases, and the content percentage of the nitrogen element in the first antireflection layer 102 gradually increases, which help to adjust light in a portion of the first antireflection layer 102 farther away from the N-type silicon substrate 100 to be incident to a portion of the first antireflection layer 102 closer to the N-type silicon substrate 100 with a smaller incident angle, and help to make the portion of the first antireflection layer 102 closer to the N-type silicon substrate 100 have a higher refractive index, to reduce the internal reflection and emission of the light in the portion of the first antireflection layer 102 closer to the N-type silicon substrate 100, thereby helping to allow more light to pass through the first antireflection layer 102 and enter the N-type silicon substrate 100. In addition, a portion of the first antireflection layer 102 closest to the N-type silicon substrate 100 has the highest silicon element content, so that lattices of the portion of the first antireflection layer 102 are more compatible with lattices of the passivation layer 101, which facilitates avoiding large lattice mismatch between the first antireflection layer 102 and the passivation layer 101, to avoid an increase of surface defects caused by the lattice mismatch, so as to improve the interface passivation effect of the first antireflection layer 102 on the N-type silicon substrate 100, thereby increasing the short-circuit current of the solar cell.

In some embodiments, the first antireflection layer 102 further includes an oxygen element, and a content percentage of the oxygen element in the first antireflection layer 102 is less than 5%. In some cases, the content percentage of the oxygen element in the first antireflection layer 102 is much less than the content percentage of the oxygen element in the second antireflection layer 103.

In some cases, most of the oxygen element in the first antireflection layer 102 may be diffused from the second antireflection layer 103 into the first antireflection layer 102.

In some embodiments, the silicon nitride material contained in the first antireflection layer 102 may be an $(Si_iN_j)$ material, and $0.5 \le i/j \le 10$, where i/j represents a ratio of a content of the silicon element to a content of the nitrogen element in the first antireflection layer 102. For example, in the first sub-antireflection layer 112 closest to the N-type silicon substrate 100, that is, the first sub-antireflection layer **112*a***, *i*/j may be 5. i/j can be determined based on atomic fraction of Si and atomic fraction of N. The atomic fraction of Si or N can be obtained by EDS test or SIMS test. In some embodiments, the atomic fraction can be an average atomic fraction of an individual element in layer(s).

It should be noted that, the mathematical formula $(Si_iN_j)$ containing "i" and "j" herein represents a content ratio of the silicon element to the nitrogen element in the first antireflection layer 102, rather than a strict chemical formula or chemical structure. Therefore, the $(Si_iN_j)$ material may include one or more stoichiometric compounds and/or one or more non-stoichiometric compounds, and values of "i" and "j" (if existent) may be integers or non-integers. The content of each element in the first antireflection layer 102 may be measured and confirmed through tests such as EDS, EELS, or SIMS.

Figure 5:
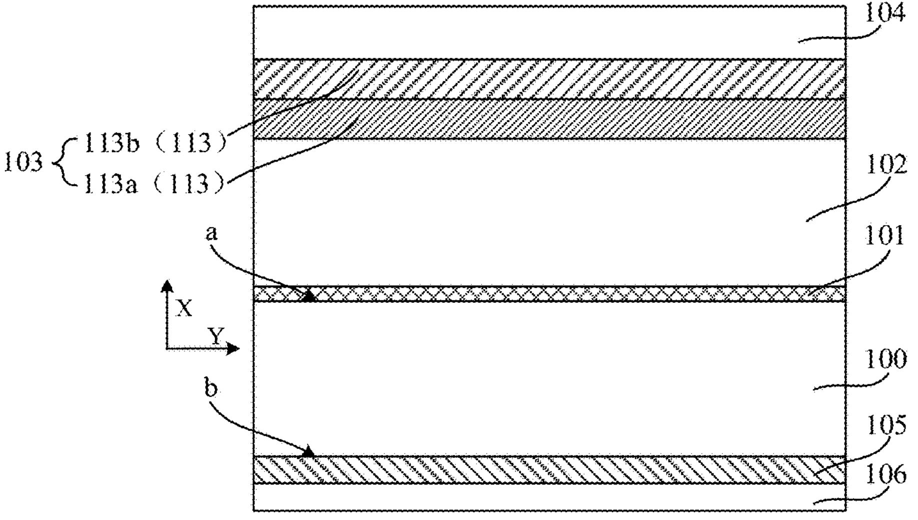

In some embodiments, referring to FIG. 5 or FIG. 6, in the direction X in which the N-type silicon substrate 100 points to the passivation layer 101, the second antireflection layer 103 includes P stacked second sub-antireflection layers 113, and the second sub-antireflection layers 113 each include a silicon oxynitride material, where P is a positive integer greater than or equal to 2; and in the direction X in which the N-type silicon substrate 100 points to the passivation layer 101, content percentages of the silicon element in adjacent second sub-antireflection layers 113 decrease layer by layer, content percentages of the nitrogen element in the adjacent second sub-antireflection layers 113 decrease layer by layer, and content percentages of the oxygen element in the adjacent second sub-antireflection layers 113 increase layer by layer.

In some cases, in the second antireflection layer 103, a second sub-antireflection layer 113 closer to the N-type silicon substrate 100 has a higher silicon element content, a higher nitrogen element content, and a lower oxygen element content, thereby adjusting the refractive index of the second sub-antireflection layer 113 to be moderate; and a second sub-antireflection layer 113 farther away from the N-type silicon substrate 100 has a lower silicon element content, a lower nitrogen element content, and a higher oxygen element content, thereby adjusting the refractive index of the second sub-antireflection layer 113 to be relatively low. In this way, the refractive index of the second antireflection layer 103 gradually decreases in the direction X, to enhance the refraction utilization of light by the second antireflection layer 103, so that more light can pass through the second antireflection layer 103 and enter the first antireflection layer 102.

In other words, refractive indexes of adjacent second sub-antireflection layers 113 decrease layer by layer in the direction X, which helps to allow light in a second sub-antireflection layer 113 farther away from the N-type silicon substrate 100 to be incident to a second sub-antireflection layer 113 closer to the N-type silicon substrate 100 with a smaller incident angle, and helps to make the second sub-antireflection layer 113 closer to the N-type silicon substrate 100 have a higher refractive index, to reduce the internal reflection and emission of the light in the second sub-antireflection layer 113 closer to the N-type silicon substrate 100, thereby helping to allow more light to pass through the second antireflection layer 103 and enter the first antireflection layer 102.

In some embodiments, P is 2 to 5

It should be noted that, in FIG. 5 and FIG. 6, an example in which the second antireflection layer 103 includes two second sub-antireflection layers 113 stacked in the direction X is used. In addition, the two second sub-antireflection layers are distinguished in labelling in FIG. 5 and FIG. 6. For example, in the examples shown in FIG. 5 and FIG. 6, the second sub-antireflection layer 113 close to the N-type silicon substrate 100 is labelled with **113*a*, and the second sub-antireflection layer 113 away from the N-type silicon substrate 100 is labelled with 113*b*. In practice, the number of second sub-antireflection layers 113 stacked in the direction X included in the second antireflection layer 103** is not limited.

In addition, FIG. 3 only illustrates that the third antireflection layer 104 has a laminated structure, FIG. 4 only illustrates that the first antireflection layer 102 has a laminated structure, FIG. 5 only illustrates that the second antireflection layer 103 has a laminated structure, and FIG. 6 illustrates that the third antireflection layer 104, the second antireflection layer 103, and the first antireflection layer 102 each have a laminated structure. In practice, alternatively, any two of the third antireflection layer 104, the second antireflection layer 103, and the first antireflection layer 102 have laminated structures.

In some embodiments, a single second sub-antireflection layer 113 has an uniformly-distributed silicon element content, an uniformly-distributed nitrogen element content, and an uniformly-distributed oxygen element content.

In some embodiments, in the direction X in which the N-type silicon substrate 100 points to the passivation layer 101, a thickness of a second sub-antireflection layer 113 is in a range of 5 nm to 40 nm, and a thickness of the second antireflection layer 103 is in a range of 10 nm to 60 nm.

In some embodiments, thicknesses of different second sub-antireflection layers 113 may all be in a range of 5 nm to 40 nm in the direction X. For example, thicknesses of different second sub-antireflection layers 113 in the direction X may be the same.

In some other embodiments, the second antireflection layer 103 has a single film layer structure, and in the direction X in which the N-type silicon substrate 100 points to the passivation layer 101, a content percentage of the silicon element in the second antireflection layer 103 gradually decreases, a content percentage of the nitrogen element in the second antireflection layer 103 gradually decreases, and a content percentage of the oxygen element in the second antireflection layer 103 gradually increases; and in the direction X in which the N-type silicon substrate 100 points to the passivation layer 101, a thickness of the third antireflection layer 104 is in a range of 10 nm to 60 nm.

In some cases, in the direction X, the content percentage of the silicon element in the second antireflection layer 103 gradually decreases, the content percentage of the nitrogen element in the second antireflection layer 103 gradually decreases, and the content percentage of the oxygen element in the second antireflection layer 103 gradually increases, which help to adjust light in a portion of the second antireflection layer 103 farther away from the N-type silicon substrate 100 to be incident to a portion of the second antireflection layer 103 closer to the N-type silicon substrate 100 with a smaller incident angle, and help to make the portion of the second antireflection layer 103 closer to the N-type silicon substrate 100 have a higher refractive index, to reduce the internal reflection and emission of light the portion of in the second antireflection layer 103 closer to the N-type silicon substrate 100, thereby helping to allow more light to pass through the second antireflection layer 103 and enter the first antireflection layer 102.

In some embodiments, the second antireflection layer 103 further includes a nitrogen element, and a content percentage of the nitrogen element in the second antireflection layer 103 ranges from 3% to 30%.

In some embodiments, the silicon oxynitride material contained in the second antireflection layer 103 may be a $Si_cN_dO_e$ material, $0.5 \leq c/d \leq 10$, and $0.25 \leq d/e \leq 2$, where c/d represents a ratio of the content of the silicon element to the content of the nitrogen element in the second antireflection layer 103, and d/e represents a ratio of the content of the nitrogen element to the content of the oxygen element in the second antireflection layer 103. For example, when the second antireflection layer 103 has a single film layer structure, c/d/e may be 4/1/2. c/d/e can be determined based on atomic fraction of Si, atomic fraction of N and atomic fraction of O. The atomic fraction of Si, N or O can be obtained by EDS test or SIMS test. In some embodiments, the atomic fraction can be an average atomic fraction of an individual element in layer(s).

In some embodiments, the aluminum oxide material contained in the passivation layer 101 is an $Al_xO_y$ material, and $1/3 \leq x/y \leq 3$, where x/y represents a ratio of a content of the aluminum element to a content of the oxygen element in the passivation layer 101.

It should be noted that, the mathematical formula $Si_cN_dO_e$ containing "c", "d", and "e" herein represents a content ratio of the silicon element, the nitrogen element to the oxygen element in the second antireflection layer 103, and the mathematical formula $Al_xO_y$ containing "x" and "y" represents a content ratio of the aluminum element to the oxygen element in the passivation layer 101, both of the mathematical formula $Si_cN_dO_e$ and the mathematical formula $Al_xO_y$ are not strict chemical formulas or chemical structures. Therefore, both the $Si_cN_dO_e$ material and the $Al_xO_y$ material may include one or more stoichiometric compounds and/or one or more non-stoichiometric compounds, and values of "c", "d", "e", "x", and "y" (if existent) may be integers or non-integers. The content of each element in the second antireflection layer 103 and the passivation layer 101 may be measured and confirmed through tests such as EDS, EELS, or SIMS.

In some embodiments, in the direction X in which the N-type silicon substrate 100 points to the passivation layer 101, a thickness of the passivation layer 101 is in a range of 1 nm to 15 nm.

In some embodiments, the tunneling dielectric layer 105 is arranged to be located on the rear surface b of the N-type silicon substrate 100, so that the tunneling dielectric layer 105 has a chemical passivation effect on the rear surface b, which is specifically that: by saturating dangling bonds of the rear surface b, the defect state density of the rear surface b is reduced, and recombination centers of the rear surface b are reduced to decrease the carrier recombination rate.

In some embodiments, the material of the tunneling dielectric layer 105 may include at least one of silicon oxide, silicon nitride, silicon oxynitride, silicon carbide, or magnesium fluoride.

In some embodiments, a type of a doped element of the doped conductive layer 106 is the same as a type of a doped element of the base region in the N-type silicon substrate 100, and a concentration of a doped element in the doped conductive layer 106 is greater than a concentration of a doped element in the base region, so that a sufficiently high potential barrier is formed on the rear surface b. The potential barrier can induce bending of the energy band of the rear surface b, thereby realizing aggregation of majority carriers and depletion of minority carriers on the rear surface b, and reducing carrier recombination on the rear surface b. Further, the tunneling dielectric layer 105 enables an asymmetric offset in the energy band of the rear surface b, so that the potential barrier to the majority carriers in the carriers is lower than the potential barrier to the minority carriers in the carriers. Therefore, the majority carriers can easily perform quantum tunneling through the rear surface b, to be transported into the doped conductive layer 106, while the minority carriers have great difficulty in passing through the tunneling dielectric layer 105, thereby achieving selective transmission of carriers.

In addition, the doped conductive layer 106 further has a field passivation effect. Specifically, the doped conductive layer 106 forms on the rear surface b an electrostatic field oriented toward the inside of the N-type silicon substrate 100, to allow the minority carriers to escape from the interface, which reduces the concentration of the minority carriers so that the carrier recombination rate on the interface of the N-type silicon substrate 100 is reduced, thereby increasing the open-circuit voltage, the short-circuit current, and the fill factor of the solar cell, and improving the photoelectric conversion efficiency of the solar cell.

In some embodiments, the material of the doped conductive layer 106 may include at least one of amorphous silicon, polycrystalline silicon, or silicon carbide.

It can be seen that the passivation contact structure provides good surface passivation for the rear surface b, and the tunneling dielectric layer 105 can allow majority carriers to tunnel into the doped conductive layer 106 while blocking recombination of minority carriers, so that the majority carriers are laterally transported in the doped conductive layer 106 and collected by a metal electrode, thereby greatly decreasing the metal contact recombination current, and increasing the open-circuit voltage and the short-circuit current of the solar cell.

Based on above, designing a novel laminated antireflection film constituted by a first antireflection layer 102, a second antireflection layer 103, and a third antireflection layer 104 that are stacked and arranging a passivation layer 101 containing an aluminum oxide material between an N-type silicon substrate 100 and the novel laminated anti-reflection film help to improve the light absorption efficiency of the N-type silicon substrate 100 and improve the light utilization rate, help to increase the short-circuit current of the solar cell to improve the photoelectric conversion efficiency, and help to improve the effect of isolation of the solar cell from the outside.

Another embodiment of the present disclosure further provides a photovoltaic module. The photovoltaic module is configured to convert received light energy into electrical energy. FIG. 7 is a schematic structural diagram of a photovoltaic module according to another embodiment of the present disclosure. It should be noted that, for portions that are the same as or corresponding to those in the foregoing embodiments, reference can be made to the corresponding descriptions of the foregoing embodiments, and details are not described below.

Referring to FIG. 7, the photovoltaic module includes a plurality of cell strings, an encapsulation glue film 41, and a cover plate 42. Each of the plurality of cell strings is formed by connecting a plurality of solar cells 40, each of which is provided by the foregoing embodiments. The encapsulation glue film 41 is configured to cover surfaces of the plurality of cell strings. The cover plate 42 is configured to cover a surface of the encapsulation glue film 41 away from the plurality of cell strings. The plurality of solar cells 40 are electrically connected in the form of an entire slice or multiple split slices to form a plurality of cell strings, and the plurality of cell strings are electrically connected by series connection and/or parallel connection.

Specifically, in some embodiments, the plurality of cell strings may be electrically connected through a conductive band 402. FIG. 7 only illustrates one positional relationship between the solar cells, that is, electrodes of the cells with the same polarity are arranged in the same direction, or an electrode of each cell with the positive polarity is arranged toward the same side, so that the conductive band connects different sides of two adjacent cells separately. In some embodiments, electrodes of the cells with different polarities may be arranged toward the same side, that is, electrodes of a plurality of adjacent cells are sequentially arranged in an order of first polarity, second polarity, first polarity . . . , and then the conductive band connects two adjacent cells on the same side.

In some embodiments, there is no spacing between cells, that is, the cells overlap each other.

In some embodiments, the encapsulation film 41 includes a first encapsulation layer and a second encapsulation layer. The first encapsulation layer covers one of the front or the back of the solar cell 40, and the second encapsulation layer covers the other of the front or the back of the solar cell 40. Specifically, at least one of the first encapsulation layer or the second encapsulation layer may be an organic encapsulation glue film such as a polyvinyl butyral (PVB) glue film, an ethylene-vinyl acetate copolymer (EVA) glue film, a polyethylene olefin elastomer (POE) glue film, or a polyethylene terephthalate (PET) glue film.

In some embodiments, there is a boundary between the first encapsulation layer and the second encapsulation layer before lamination. After the lamination processing, a photovoltaic module is formed and there is no longer any concept of the first encapsulation layer or the second encapsulation layer. That is, the first encapsulation layer and the second encapsulation layer have formed an integral encapsulation film 41.

In some embodiments, the cover plate 42 may be a cover plate with a light-transmitting function such as a glass cover plate or a plastic cover plate. Specifically, a surface of the cover plate 42 facing the encapsulation film 41 may be an uneven surface, thereby increasing the utilization rate of incident light. The cover plate 42 includes a first cover plate and a second cover plate. The first cover plate is opposite to the first encapsulation layer, and the second cover plate is opposite to the second encapsulation layer.

Still another embodiment of the present disclosure further provides a solar cell manufacturing method, which is used for forming the solar cell provided in the foregoing embodiments. The solar cell manufacturing method provided in the still another embodiment of the present disclosure is described below in detail with reference to the accompanying drawings. FIGS. 8 to 9 are schematic sectional structural diagrams corresponding to steps in the solar cell manufacturing method according to the still another embodiment of the present disclosure. It should be noted that, for portions that are the same as or corresponding to those in the foregoing embodiments, reference may be made to the corresponding descriptions of the foregoing embodiments, and details are not described below.

Referring to FIG. 8, an N-type silicon substrate 100 is provided. The N-type silicon substrate 100 has a front surface a and a rear surface b that are opposite to each other.

In some embodiments, providing the N-type silicon substrate 100 may include the following steps: providing a base region and performing double-sided texturing; and performing boron diffusion processing on the front surface of the base region to form a P-type emitter, where the P-type emitter occupies a portion of the surface layer space of the base region on the sun-facing side, and the P-type emitter and an N-type base region constitute the N-type silicon substrate 100.

Specifically, the base region is cleaned, and a pyramid texture surface is prepared by wet chemical etching. The pyramid texture surface can reduce the reflection of light on the surface of the base region, thereby increasing the light absorption and utilization rate in the base region and improving the conversion efficiency of the solar cell. It should be noted that, the specific operation manner of texturing is not limited in the present disclosure. For example, texturing may be performed by using, but not limited to, a wet texturing process. For example, an alkaline solution (for example, a sodium hydroxide solution) may be used for texturing. The corrosion of the sodium hydroxide solution is anisotropic, facilitating preparation of a pyramidal microstructure. The pyramidal microstructure may be a tetrahedral structure, a tetrahedron-like structure, a pentahedral structure, a pentahedron-like structure, or the like. In addition, the texturing process may alternatively be chemical etching, laser etching, a mechanical method, plasma etching, or the like.

A planarization process (for example, alkali polishing) is performed on the rear surface b of the N-type silicon substrate 100; and the polished N-type silicon substrate 100 is washed with water and dried.

With continued reference to FIG. 8, a tunneling dielectric layer 105 and a doped conductive layer 106 are sequentially formed on the rear surface b in a direction away from the rear surface b.

In some embodiments, the tunneling dielectric layer 105 and the doped conductive layer 106 have doped elements of the same conductivity type, and the doped conductive layer 106 and the N-type silicon substrate 100 have doped elements of the same conductivity type.

Formation of the tunneling dielectric layer 105 and the doped conductive layer 106 may include the following steps.

In some embodiments, the tunneling dielectric layer 105 is formed by a deposition process. Specifically, the material of the tunneling dielectric layer 105 includes silicon oxide, and the deposition process includes a chemical vapor deposition process. In other embodiments, the tunneling dielectric layer may be formed by an in-situ generation process. Specifically, the tunneling dielectric layer may be generated in situ on the N-type silicon substrate 100 by a thermal oxidation process, a nitric acid oxidation process, or the like.

In some embodiments, after the tunneling dielectric layer 105 is formed, a polysilicon layer is formed by depositing intrinsic polysilicon, and then doped with phosphorus ions by ion implantation and thermal diffusion, to form an N-type doped polysilicon layer, where the doped polysilicon layer serves as the doped conductive layer 106. In the direction X, the thickness of the doped conductive layer 106 may be set to 50 nm to 200 nm, such as 100 nm, 120 nm, or 140 nm.

It should be noted that, a detailed description is provided below by using formation of the stacked passivation layer 101, first antireflection layer 102, second antireflection layer 103, and third antireflection layer 104 shown in FIG. 6 as an example.

In some cases, the passivation layer 101, the first antireflection layer 102, the second antireflection layer 103, and the third antireflection layer 104 may be formed by using, but not limited to, processes such as chemical vapor deposition, low pressure chemical vapor deposition, plasma enhanced chemical vapor deposition (including direct plasma deposition and indirect plasma deposition), or magnetron sputtering.

In some embodiments, the passivation layer 101 is formed by an atomic layer deposition process. Reactants include trimethylaluminum and water. The deposition temperature is 150° C. to 350° C., such as 200° C., 250° C., or 300° C. A refractive index of the passivation layer 101 at a wavelength of 632 nm is 1.6 to 1.7, such as 1.63, 1.65, or 1.67. In the direction X, the thickness of the passivation layer 101 is 3 nm to 15 nm, such as 5 nm, 7 nm, or 9 nm.

After the passivation layer 101 is formed, the passivation layer 101 is placed in a protective gas atmosphere for high-temperature annealing processing to remove residual water molecules and organic functional groups, where an annealing temperature is 450° C. to 550° C., such as 475° C., 500° C., or 525° C., and an annealing time is longer than 10 min, such as 12 min, 14 min, or 16 min. It should be noted that, the foregoing "protective gas" may be any gas that does not participate in the reaction, for example, an inert gas. In some embodiments, nitrogen may also be used as the protective gas.

With continued reference to FIG. 9, a first antireflection layer 102 containing M first sub-antireflection layers 112 is formed on the front surface a. In FIG. 9, M being 3 is used as an example.

In some embodiments, different deposition processes are used to sequentially form the M first sub-antireflection layers 112, where reactants silane and ammonia are provided in each deposition process, and a flow ratio of silane to ammonia in the (D-1)$^{th}$ deposition process is controlled to be greater than a flow ratio of silane to ammonia in the D$^{th}$ deposition process (2≤D≤M, where D is a positive integer), so that in the direction X, content percentages of the silicon element in adjacent first sub-antireflection layers 112 decrease layer by layer, and content percentages of the nitrogen element in the adjacent first sub-antireflection layers 112 increase layer by layer.

For example, a first deposition process is used to form a first sub-antireflection layer 112*a* on the front surface a; a second deposition process is used to form a first sub-antireflection layer 112*b* on a surface of the first sub-antireflection layer 112*a* away from the front surface a; and a third deposition process is used to form a first sub-antireflection layer 112*c* on a surface of the first sub-antireflection layer 112*b* away from the front surface a. The first deposition process, the second deposition process, and the third deposition process may all be plasma enhanced chemical vapor deposition processes, and in each of the M deposition processes, a flow ratio of silane to ammonia ranges from 1/15 to 2/5, such as 1/6, 1/9, or 1/12; and a pulse power per unit area ranges from 30 mW/cm$^2$ to 40 mW/cm$^2$, such as 33 mW/cm$^2$, 35 mW/cm$^2$, or 37 mW/cm$^2$. For example, an overall refractive index of the first antireflection layer 102 containing an ($Si_iN_j$) material at a wavelength of 632 nm is 1.9 to 2.2, such as 2.0, 2.05, or 2.1.

In some embodiments, the flow ratio of silane to ammonia in the first deposition process is 0.2 to 0.4, the flow ratio of silane to ammonia in the second deposition process is 0.1 to 0.3, and the flow ratio of silane to ammonia in the third deposition process is 0.05 to 0.2. For example, the flow ratio of silane to ammonia in the first deposition process is 0.28, the flow ratio of silane to ammonia in the second deposition process is 0.17, and the flow ratio of silane to ammonia in the third deposition process is 0.1. Referring to FIG. 6, a second antireflection layer 103 containing P second sub-antireflection layers 113 is formed on a side of the first antireflection layer 102 away from the front surface a. In FIG. 6, P being 2 is used as an example.

In some embodiments, different deposition processes are used to sequentially form the P second sub-antireflection layers 113, where reactants silane, nitrous oxide, and ammonia are provided in each deposition process, and a flow ratio of ammonia to nitrous oxide in the (E−1)$^{th}$ deposition process is controlled to be greater than a flow ratio of ammonia to nitrous oxide in the Eth deposition process (2≤E≤P, where E is a positive integer), so that content percentages of the silicon element in adjacent second sub-antireflection layers 113 decrease layer by layer, content percentages of the nitrogen element in the adjacent second sub-antireflection layers 113 decrease layer by layer, and content percentages of the oxygen element in the adjacent second sub-antireflection layers 113 increase layer by layer.

In some cases, a flow ratio of silane to nitrous oxide in the (E−1)$^{th}$ deposition process is not required to be greater or less than a flow ratio of silane to nitrous oxide in the Eth deposition process, as long as the flow ratio of silane to nitrous oxide is controlled to be not less than 0.1. For example, a fourth deposition process is used to form a second sub-antireflection layer 113*a* on the first antireflection layer 102; and a fifth deposition process is used to form a second sub-antireflection layer 113*b* on a surface of the second sub-antireflection layer 113*a* away from the first antireflection layer 102. Both the fourth deposition process and the fifth deposition process may be plasma enhanced chemical vapor deposition processes, and in each of the P deposition processes, a flow ratio of silane to nitrous oxide is not less than 1/10, such as 1/4, 1/6, or 1/8; and a pulse power per unit area is 25 mW/cm$^2$ to 40 mW/cm$^2$, such as 28 mW/cm$^2$, 30 mW/cm$^2$, 33 mW/cm$^2$, or 36 mW/cm$^2$. For example, an overall refractive index of the second antireflection layer 103 containing a $Si_cN_dO_e$ material at a wavelength of 632 nm is 1.45 to 1.8, such as 1.5, 1.6, or 1.7.

In some embodiments, three deposition processes are used to form the second antireflection layer 103, where the flow ratio of ammonia to nitrous oxide in the first deposition process is 0.5 to 0.9, the flow ratio of ammonia to nitrous oxide in the second deposition process is 0.4 to 0.7, the flow ratio of ammonia to nitrous oxide in the third deposition process is 0.3 to 0.5. For example, the flow ratio of ammonia to nitrous oxide in the first deposition process is 0.7, the flow ratio of ammonia to nitrous oxide in the second deposition process is 0.5, and the flow ratio of ammonia to nitrous oxide in the third deposition process is 0.4.

With continued reference to FIG. 6, a third antireflection layer 104 containing N third sub-antireflection layers 114 is formed on a side of the second antireflection layer 103 away from the front surface a. In FIG. 6, N being 2 is used as an example.

In some embodiments, different deposition processes are used to sequentially form the N third sub-antireflection layers 114, where reactants silane and nitrous oxide are provided in each deposition process, and a flow ratio of silane to nitrous oxide in the $(F-1)^{th}$ deposition process is controlled to be greater than a flow ratio of silane to nitrous oxide in the $F^{th}$ deposition process ($2 \le F \le N$, where F is a positive integer), so that in the direction X, content percentages of the silicon element in adjacent third sub-antireflection layers 114 decrease layer by layer, and content percentages of the oxygen element in the adjacent third sub-antireflection layers 114 increase layer by layer.

In some embodiments, three deposition processes are used to form the third antireflection layer 104, where the flow ratio of silane to nitrous oxide in the first deposition process is 0.05 to 0.1, the flow ratio of ammonia to nitrous oxide in the second deposition process is 0.04 to 0.07, the flow ratio of ammonia to nitrous oxide in the third deposition process is 0.03 to 0.05. For example, the flow ratio of ammonia to nitrous oxide in the first deposition process is 0.075, the flow ratio of ammonia to nitrous oxide in the second deposition process is 0.062, and the flow ratio of ammonia to nitrous oxide in the third deposition process is 0.04.

It should be noted that, since nitrous oxide is relatively active, it is relatively difficult to control the thickness uniformity of the formed third sub-antireflection layers 114 in the direction X. Therefore, in some embodiments, the thickness of the third antireflection layer 104 in the direction X is not uniform.

For example, a sixth deposition process is used to form a third sub-antireflection layer 114*a* on the second antireflection layer 103; and a seventh deposition process is used to form a third sub-antireflection layer 114*b* on a surface of the third sub-antireflection layer 114*a* away from the second antireflection layer 103. Both the sixth deposition process and the seventh deposition process may be plasma enhanced chemical vapor deposition processes, and in each of the N deposition processes, a flow ratio of silane to nitrous oxide is 0.05 to 0.10, such as 0.06, 0.075, or 0.09; and a pulse power per unit area is 20 $mW/cm^2$ to 35 $mW/cm^2$, such as 25 $mW/cm^2$, 30 $mW/cm^2$, 32 $mW/cm^2$, or 34 $mW/cm^2$. For example, an overall refractive index of the third antireflection layer 104 containing a $Si_aO_b$ material at a wavelength of 632 nm is 1.30 to 1.65, such as 1.35, 1.45, or 1.55.

Figure 10:
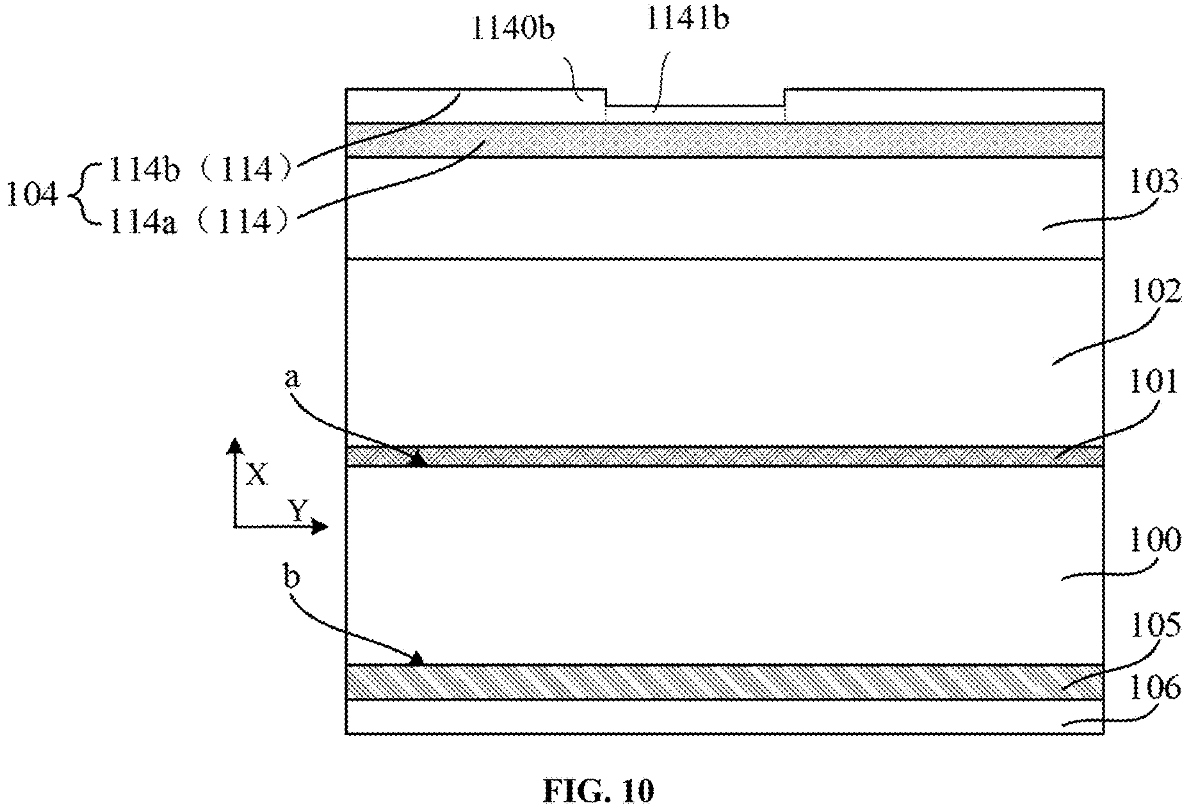
FIG. 10 is a schematic sectional structural diagram of a solar cell according to an embodiment of the present disclosure.

In some embodiments, referring to FIG. 10, the third sub-antireflection layer 114*b* of the third antireflection layer 104 includes a first portion 1140*b* and a second portion 1141*b* in a direction Y perpendicular to the direction away from the second antireflection layer 103 (i.e., the direction Y perpendicular to the direction X), and thicknesses of the first portion 1140*b* and the second portion 1141*b* in the direction X in which the N-type silicon substrate 100 points to the passivation layer 101 are different, that is, the third sub-antireflection layer 114*b* is not uniform in thickness in the direction X, or the third sub-antireflection layer 114*b* has an uneven surface facing away from the second antireflection layer 103.

It should be noted that, FIG. 10 is only an example of the non-uniform thickness of the third sub-antireflection layer 114*b* in the direction X, and only one first portion 1140*b* and one second portion 1141*b* are illustrated in FIG. 2. In practice, the third antireflection layer 104 may have a plurality of first portion 1140*b* and a plurality of second portions 1141*b*, and thicknesses of different second portions 1141*b* in the direction X may be different. In addition, the first portion 1140*b* and the second portion 1141*b* are differentiated by using dashed lines in FIG. 10.

Although the embodiments of the present disclosure have been disclosed with reference to exemplary embodiments, the embodiments are not intended to limit the claims. Any person skilled in the art may make several possible changes and modifications without departing from the ideas of the present disclosure. Therefore, the protection scope of the present disclosure should be subject to the scope defined by the claims of the present disclosure. In addition, the embodiments in the specification of the present disclosure and the shown accompanying drawings are only examples, and do not cover the entire protection scope of the claims of the present disclosure.

Those skilled in the art should appreciate that that the foregoing implementations are specific embodiments for implementing the present disclosure, and in practice, various changes may be made in the form and details without departing from the spirit and scope of the embodiments of the present disclosure. Any person skilled in the art may make variations and modifications without departing from the spirit and scope of the embodiments of the present disclosure. Therefore, the protection scope of the embodiments of the present disclosure shall be defined by the appended claims.

What is claimed is:

1. A solar cell, comprising:

a silicon substrate, having a front surface and a rear surface opposite to the front surface, wherein the silicon substrate includes at least one of a phosphorus (P) element, a bismuth (Bi) element, an antimony (Sb) element, or an arsenic (As) element;

a passivation layer including an aluminum oxide ($Al_xO_y$) material formed over the front surface, wherein $1/3 \le x/y \le 3$, x/y representing a ratio of content of aluminum to content of oxygen in the passivation layer;

a first antireflection layer including a silicon nitride "($Si_iN_j$)" material formed over the passivation layer, wherein $0.5 \le i/j \le 10$, i/j representing a ratio of content of silicon to content of nitrogen in the first antireflection layer;

a second antireflection layer including a silicon oxynitride ($Si_cN_dO_e$) material formed over the first antireflection layer, wherein $0.5 \le c/d \le 10$, and $0.25 \le d/e \le 2$, c/d representing a ratio of content of silicon to content of nitrogen in the second antireflection layer, and d/e representing a ratio of content of nitrogen to content of oxygen in the second antireflection layer;

a third antireflection layer including a silicon oxide ($Si_aO_b$) material formed over the second antireflection layer, wherein $0.5 \le a/b \le 3$, a/b representing a ratio of content of silicon to content of oxygen in the third antireflection layer;

a tunneling dielectric layer formed over the rear surface; and a doped conductive layer formed over the tunneling dielectric layer;

wherein in a direction away from the first antireflection layer, content percentage of silicon in the second antireflection layer gradually decreases, content percentage of nitrogen in the second antireflection layer gradually decreases, and content percentage of oxygen in the second antireflection layer gradually increases;

wherein the second antireflection layer includes a plurality second sub-antireflection layers stacked in the direction away from the first antireflection layer, each of the plurality of second sub-antireflection layers includes a silicon oxynitride material; and wherein in the direction away from the first antireflection layer, content percentage of silicon in the plurality of second sub-antireflection layers decreases layer by layer, content percentage of nitrogen in the plurality of second sub-antireflection layers decreases layer by layer, and content percentage of oxygen in the plurality of second sub-antireflection layers increases layer by layer.

2. The solar cell according to claim 1, wherein the third antireflection layer has an uneven surface facing away from the second antireflection layer.

3. The solar cell according to claim 1, wherein the third antireflection layer has a minimum thickness and a maximum thickness, and a ratio of the minimum thickness to the maximum thickness is not greater than 0.5.

4. The solar cell according to claim 1, wherein in a direction away from the second antireflection layer, content percentage of silicon in the third antireflection layer gradually decreases, and content percentage of oxygen in the third antireflection layer gradually increases.

5. The solar cell according to claim 4, wherein the third antireflection layer includes N third sub-antireflection layers stacked in the direction away from the second antireflection layer, each of the N third sub-antireflection layers includes a silicon oxide material, wherein N is a positive integer greater than or equal to 2; and in the direction away from the second antireflection layer, content percentage of silicon in the N third sub-antireflection layers decreases layer by layer, and content percentage of oxygen in the N third sub-antireflection layers increases layer by layer.

6. The solar cell according to claim 5, wherein in the direction away from the second antireflection layer, a single third sub-antireflection layer is 2 nm to 15 nm in thickness, and the third antireflection layer is 2 nm to 40 nm in thickness.

7. The solar cell according to claim 5, wherein a single third sub-antireflection layer has uniformly-distributed silicon content and uniformly-distributed oxygen content.

8. The solar cell according to claim 1, wherein the third antireflection layer is 2 nm to 40 nm in thickness.

9. The solar cell according to claim 8, wherein the tunneling dielectric layer is 1 nm to 2.5 nm in thickness, and the third antireflection layer is thicker than the tunneling dielectric layer.

10. The solar cell according to claim 1, wherein the third antireflection layer further includes nitrogen, and content percentage of nitrogen in the third antireflection layer is less than 5%.

11. The solar cell according to claim 1, wherein in a direction away from the passivation layer, content percentage of silicon in the first antireflection layer gradually decreases, and content percentage of nitrogen in the first antireflection layer gradually increases.

12. The solar cell according to claim 11, wherein the first antireflection layer includes M first sub-antireflection layers stacked in the direction away from the passivation layer, each of the M first sub-antireflection layers includes a silicon nitride material, wherein M is a positive integer greater than or equal to 2; and in the direction away from the passivation layer, content percentage of silicon in the M first sub-antireflection layers decreases layer by layer, and content percentage of nitrogen in the M first sub-antireflection layers increases layer by layer.

13. The solar cell according to claim 12, wherein thicknesses of the M first sub-antireflection layers increase layer by layer in the direction away from the passivation layer, one of the M first sub-antireflection layers closest to the passivation layer is 2 nm to 15 nm in thickness, and the first antireflection layer is 5 nm to 50 nm in thickness.

14. The solar cell according to claim 12, wherein a single first sub-antireflection layer has uniformly-distributed silicon content and uniformly-distributed nitrogen content.

15. The solar cell according to claim 1, wherein the first antireflection layer further includes oxygen, and content percentage of oxygen in the first antireflection layer is less than 5%.

16. The solar cell according to claim 1, wherein in the direction away from the first antireflection layer, a single second sub-antireflection layer is 5 nm to 40 nm in thickness, and the second antireflection layer is 10 nm to 60 nm in thickness.

17. The solar cell according to claim 1, wherein the second antireflection layer is 10 nm to 60 nm in thickness.

18. A photovoltaic module, comprising:

a plurality of cell strings, each formed by connecting a plurality of solar cells;

an encapsulation film, configured to cover surfaces of the plurality of cell strings; and a cover plate, configured to cover a surface of the encapsulation film facing away from the plurality of cell strings;

wherein each of the plurality of solar cells comprises:

a silicon substrate, having a front surface and a rear surface opposite to the front surface, wherein the silicon substrate includes at least one of a phosphorus (P) element, a bismuth (Bi) element, an antimony (Sb) element, or an arsenic (As) element;

a passivation layer including an aluminum oxide ($Al_xO_y$) material formed over the front surface, wherein $1/3 \leq x/y \leq 3$, x/y representing a ratio of content of aluminum to content of oxygen in the passivation layer;

a first antireflection layer including a silicon nitride "($Si_iN_j$)" material formed over the passivation layer, wherein $0.5 \leq i/j \leq 10$, i/j representing a ratio of content of silicon to content of nitrogen in the first antireflection layer;

a second antireflection layer including a silicon oxynitride ($Si_cN_dO_e$) material formed over the first antireflection layer, wherein $0.5 \leq c/d \leq 10$, and $0.25 \leq d/e \leq 2$, c/d representing a ratio of content of silicon to content of nitrogen in the second antireflection layer, and d/e representing a ratio of content of nitrogen to content of oxygen in the second antireflection layer;

a third antireflection layer including a silicon oxide ($Si_aO_b$) material formed over the second antireflection layer, wherein 0.5≤a/b≤3, a/b representing a ratio of content of silicon to content of oxygen in the third antireflection layer;

a tunneling dielectric layer formed over the rear surface; and a doped conductive layer formed over the tunneling dielectric layer;

wherein in a direction away from the first antireflection layer, content percentage of silicon in the second antireflection layer gradually decreases, content percentage of nitrogen in the second antireflection layer gradually decreases, and content percentage of oxygen in the second antireflection layer gradually increases;

wherein the second antireflection layer includes a plurality second sub-antireflection layers stacked in the direction away from the first antireflection layer, each of the plurality of second sub-antireflection layers includes a silicon oxynitride material; and wherein in the direction away from the first antireflection layer, content percentage of silicon in the plurality of second sub-antireflection layers decreases layer by layer, content percentage of nitrogen in the plurality of second sub-antireflection layers decreases layer by layer, and content percentage of oxygen in the plurality of second sub-antireflection layers increases layer by layer.

* * * * *